US012353712B2

(12) United States Patent
Tsuruya et al.

(10) Patent No.: US 12,353,712 B2
(45) Date of Patent: Jul. 8, 2025

(54) STORAGE DEVICE

(71) Applicant: Hitachi, Ltd., Tokyo (JP)

(72) Inventors: Masahiro Tsuruya, Tokyo (JP);
Nagamasa Mizushima, Tokyo (JP);
Tomohiro Yoshihara, Tokyo (JP);
Kentaro Shimada, Tokyo (JP)

(73) Assignee: HITACHI VANTARA, LTD.,
Yokohama (JP)

( * ) Notice: Subject to any disclaimer, the term of this patent is extended or adjusted under 35 U.S.C. 154(b) by 0 days.

(21) Appl. No.: 18/118,249

(22) Filed: Mar. 7, 2023

(65) Prior Publication Data

US 2023/0205419 A1 Jun. 29, 2023

Related U.S. Application Data

(63) Continuation of application No. 17/752,923, filed on May 25, 2022, now Pat. No. 11,625,168, which is a (Continued)

(30) Foreign Application Priority Data

Apr. 1, 2020 (JP) .................. 2020-066145
Aug. 20, 2020 (JP) .................. 2020-139199

(51) Int. Cl.
G06F 3/06 (2006.01)
G06F 16/174 (2019.01)
H03M 7/30 (2006.01)

(52) U.S. Cl.
CPC .......... *G06F 3/0608* (2013.01); *G06F 3/0641* (2013.01); *G06F 16/1744* (2019.01);
(Continued)

(58) Field of Classification Search
CPC .. G06F 16/1744; G06F 3/0641; G06F 3/0659; G06F 3/0661; G06F 3/0673; G06F 2212/401; H03M 7/70; G11C 2207/102
See application file for complete search history.

(56) References Cited

U.S. PATENT DOCUMENTS 6,175,896 B1  1/2001 Bui
6,275,588 B1  8/2001 Videcrantz et al.
(Continued)

FOREIGN PATENT DOCUMENTS

CN    1449544 A   10/2003
CN  101136233 A    3/2008
(Continued)

OTHER PUBLICATIONS

Translation of WO 2018/179243 application provided by USPTO translation services (Year: 2018).*
(Continued)

*Primary Examiner* — Tim T Vo
*Assistant Examiner* — Janice M. Girouard
(74) *Attorney, Agent, or Firm* — MATTINGLY & MALUR, PC

(57) ABSTRACT

The storage device includes a first memory, a process device that stores data in the first memory and reads the data from the first memory, and an accelerator that includes a second memory different from the first memory. The accelerator stores compressed data stored in one or more storage drives storing data, in the second memory, decompresses the compressed data stored in the second memory to generate plaintext data, extracts data designated in the process device from the plaintext data, and transmits the extracted designated data to the first memory.

7 Claims, 15 Drawing Sheets

Related U.S. Application Data continuation of application No. 17/172,206, filed on Feb. 10, 2021, now Pat. No. 11,360,669.

(52) U.S. Cl.
CPC .......... *G06F 3/0659* (2013.01); *G06F 3/0661* (2013.01); *G06F 3/0673* (2013.01); *G06F 2212/401* (2013.01); *G11C 2207/102* (2013.01); *H03M 7/70* (2013.01)

(56) References Cited

U.S. PATENT DOCUMENTS

| | | |
|---|---|---|
| 6,724,391 B1 | 4/2004 | Peled et al. |
| 6,822,589 B1 | 11/2004 | Dye et al. |
| 9,116,858 B1 | 8/2015 | Yokoi et al. |
| 2001/0038642 A1 | 11/2001 | Alvarez, II et al. |
| 2002/0091905 A1 | 7/2002 | Geiger et al. |
| 2003/0191876 A1 | 10/2003 | Fallon |
| 2008/0049947 A1 | 2/2008 | Yoneda et al. |
| 2011/0307471 A1 | 12/2011 | Sheinin |
| 2012/0265953 A1 | 10/2012 | Matsuzaki et al. |
| 2014/0025886 A1 | 1/2014 | Tanoue et al. |
| 2014/0177710 A1 | 6/2014 | Komi et al. |
| 2014/0201401 A1* | 7/2014 | Tokumitsu ............... G06F 13/36 710/104 |
| 2015/0261456 A1 | 9/2015 | Alcantara et al. |
| 2015/0324134 A1 | 11/2015 | Sendelbach et al. |
| 2015/0350301 A1* | 12/2015 | Yokoi .................... H04L 67/06 709/212 |
| 2016/0004642 A1 | 1/2016 | Sugimoto et al. |
| 2016/0233880 A1 | 8/2016 | Mizushima et al. |
| 2016/0239209 A1 | 8/2016 | Malyugin et al. |
| 2016/0335215 A1* | 11/2016 | Biran .................... G06F 9/547 |
| 2017/0017395 A1 | 1/2017 | Kurokawa et al. |
| 2017/0102950 A1 | 4/2017 | Chamberlain et al. |
| 2017/0147624 A1 | 5/2017 | Burger et al. |
| 2017/0351429 A1 | 12/2017 | Dimitrov et al. |
| 2018/0074757 A1* | 3/2018 | Yamaguchi ........... G06F 3/0659 |
| 2018/0152733 A1 | 5/2018 | Karaje et al. |
| 2018/0173736 A1 | 6/2018 | Watanabe |
| 2019/0132611 A1 | 5/2019 | Matsubara et al. |
| 2019/0196746 A1 | 6/2019 | Fujimoto et al. |

FOREIGN PATENT DOCUMENTS

| | | |
|---|---|---|
| CN | 102736988 A | 10/2012 |
| CN | 103888777 A | 6/2014 |
| CN | 104956312 A | 9/2015 |
| CN | 106030498 A | 10/2016 |
| CN | 106030499 A | 10/2016 |
| CN | 107250991 A | 10/2017 |
| CN | 109726034 A | 5/2019 |
| JP | 2005-51479 A | 2/2005 |
| JP | 2018-037069 A | 3/2018 |
| WO | 2015/075837 A1 | 5/2015 |
| WO | 2015/162755 A1 | 10/2015 |
| WO | WO-2018179243 A1 * | 10/2018 ............. G06F 13/12 |

OTHER PUBLICATIONS

Notice of Reasons for Refusal dated Feb. 17, 2022, issued in corresponding Japanese Patent Application No. 2020-139199.

Chinese Office Action received in corresponding Chinese Application No. 202110122069.1 dated May 10, 2023.

Translation of Chinese Office Action received in corresponding Chinese Application No. 202110122069.1 dated May 10, 2023.

Chinese Office Action received in corresponding Chinese Application No. 202110122069.1 dated Dec. 14, 2023.

\* cited by examiner (COMPARATIVE EXAMPLE)

FIG. 7

| # | COMPONENT | TRANSFER DIRECTION | COMPARATIVE EXAMPLE | | EMBODIMENT 1 |
|---|---|---|---|---|---|
| | | | 8 kB COMPRESSION | 64 kB COMPRESSION | 64 kB COMPRESSION |
| 1 | DRIVE 130 | OUT | 4+5+4 | 20+30+26 | 20+30+26 |
| 2 | DRAM 220 | IN | --- | --- | 20+30+26 |
| 3 | | OUT | --- | --- | 20+30+26 |
| 4 | FPGA 210 | IN | --- | --- | 20+30+26 |
| 5 | | OUT | --- | --- | 64+64+64 |
| 6 | DRAM 220 | IN | --- | --- | 64+64+64 |
| 7 | | OUT | --- | --- | 8+8+8 |
| 8 | FE SW 122 | TO DRAM | 4+5+4 | 20+30+26 | 8+8+8 |
| 9 | DRAM 125 | IN | 4+5+4 | 20+30+26 | --- |
| 10 | | OUT | 4+5+4 | 20+30+26 | --- |
| 11 | FE SW 122 | FROM DRAM | 4+5+4 | 20+30+26 | --- |
| 12 | COMPRESSION DECOMPRESSION ENGINE 127 | IN | 4+5+4 | 20+30+26 | --- |
| 13 | | OUT | 8+8+8 | 64+64+64 | --- |
| 14 | FE SW 122 | TO DRAM | 8+8+8 | 64+64+64 | --- |
| 15 | DRAM 125 | IN | 8+8+8 | 64+64+64 | 8+8+8 |
| 16 | | OUT | --- | 8+8+8 | --- |
| 17 | | IN | --- | 8+8+8 | --- |
| 18 | | OUT | 8+8+8 | 8+8+8 | 8+8+8 |
| 19 | FE SW 122 | FROM DRAM | 8+8+8 | 8+8+8 | 8+8+8 |
| SUM | DRAM 220 | IN/OUT | --- | --- | 368 |
| | DRAM 125 | IN/OUT | 48 | 416 | 48 |
| | FE SW 122 | TO/FROM | 74 | 368 | 48 |

(kB)

(COMPARATIVE EXAMPLE)

FIG. 14

| # | COMPONENT | TRANSFER DIRECTION | COMPARATIVE EXAMPLE 64 kB COMPRESSION | EMBODIMENT 1 64 kB COMPRESSION | EMBODIMENT 3 64 kB COMPRESSION |
|---|---|---|---|---|---|
| 1 | DRIVE 130 | OUT | 20+30+26 | 20+30+26 | 20+30+26 |
| A | FE SW 122 | TO DRAM | --- | --- | 20+30+26 |
| B | DRAM 125 | IN | --- | --- | 20+30+26 |
| C | | OUT | --- | --- | 20+30+26 |
| D | FE SW 122 | FROM DRAM | --- | --- | 20+30+26 |
| 2 | DRAM 220 | IN | --- | 20+30+26 | 20+30+26 |
| 3 | | OUT | --- | 20+30+26 | 20+30+26 |
| 4 | FPGA 210 | IN | --- | 20+30+26 | 20+30+26 |
| 5 | | OUT | --- | 64+64+64 | 64+64+64 |
| 6 | DRAM 220 | IN | --- | 64+64+64 | 64+64+64 |
| 7 | | OUT | --- | 8+8+8 | 8+8+8 |
| 8 | FE SW 122 | TO DRAM | 20+30+26 | 8+8+8 | 8+8+8 |
| 9 | DRAM 125 | IN | 20+30+26 | --- | --- |
| 10 | | OUT | 20+30+26 | --- | --- |
| 11 | FE SW 122 | FROM DRAM | 20+30+26 | --- | --- |
| 12 | COMPRESSION DECOMPRESSION ENGINE 127 | IN | 20+30+26 | --- | --- |
| 13 | | OUT | 64+64+64 | --- | --- |
| 14 | FE SW 122 | TO DRAM | 64+64+64 | --- | --- |
| 15 | DRAM 125 | IN | 64+64+64 | 8+8+8 | 8+8+8 |
| 16 | | OUT | 8+8+8 | --- | --- |
| 17 | | IN | 8+8+8 | --- | --- |
| 18 | | OUT | 8+8+8 | 8+8+8 | 8+8+8 |
| 19 | FE SW 122 | FROM DRAM | 8+8+8 | 8+8+8 | 8+8+8 |
| SUM | DRAM 220 | IN/OUT | --- | 368 | 368 |
| | DRAM 125 | IN/OUT | 416 | 48 | 200 |
| | FE SW 122 | TO/FROM | 368 | 48 | 200 |

(kB)

STORAGE DEVICE

CLAIM OF PRIORITY

The present application claims priority from Japanese patent applications JP 2020-066145 filed on Apr. 1, 2020, and JP 2020-139199 filed on Aug. 20, 2020, the content of which are hereby incorporated by reference into this application.

BACKGROUND OF THE INVENTION

1. Field of the Invention

The present invention relates to a storage device and specifically to a storage device that reduces an amount of stored data by lossless compression.

2. Description of Related Art

Data storage is a basic function of a computer system. In many computer systems, in case of dealing with a large amount of data, the data is stored in a storage device. The storage device stores data in an internal storage medium (storage drive) such as a hard disk drive (HDD) or a solid state drive (SSD) and performs a process of writing or reading the data according to an instruction from the outside. The data storage cost is calculated as the product of a bit cost of the storage medium (storage medium price/storage medium capacity) and an amount of recorded data in a simple definition (without considering a running cost and the like).

In recent years, for the purpose of reducing data storage costs, a technique for reducing the amount of physical data stored in a storage medium by a lossless compression algorithm is widely used. In a storage device having a data amount reduction function, a compression process is performed before data is written to a medium, and a decompression process is performed after the data is read from the medium. However, since the compression and decompression of the data are processes that require heavy loads, if the processes are executed by a central processing unit (CPU) in the storage device, the performance of writing and reading data according to an instruction from the outside deteriorates.

For example, US-A-2017/0147624 discloses a device that includes a CPU bus equipped with an accelerator that can perform data compression and decompression at high speed with dedicated hardware, and off-loads the compression and decompression of the data stored in the memory and data input and output on the bus, to reduce the CPU load.

On the other hand, in a storage device having a data amount reduction function, in order to further reduce the data storage cost, it is necessary to realize a high data reduction rate by lossless compression. One of the methods thereof is to compress data in large units.

For example, when there are eight items of 8 kB data, compared with a case where each is individually compressed, in case where one item of 64 kB data configured by arranging eight items of data is compressed, the data reduction rate is higher. This is because the lossless compression algorithm used in the storage device is generally a slide dictionary method, and the larger the compression unit, the wider the dictionary search space, so the probability for finding a matching character string becomes higher.

There is a disadvantage in increasing the data compression unit. It is assumed that one item of 8 kB data is to be read from eight items of 8 kB data (64 kB data in total) that are compressed to 20 kB, according to an instruction from the outside. The storage device is required to read 20 kB data from the storage medium from the memory, decompress the data, load the 64 kB data to the memory, extract the 8 kB data, and output the data to the outside.

If a storage device having a data amount reduction function is configured by using an accelerator connection aspect as in US-A-2017/0147624, when the compression unit of the data is increased to 64 kB or the like, an amount of data to be read and written from the memory becomes extremely larger than the amount of data to be output to the outside.

Comparing the memory bandwidth of the CPU and the transfer bandwidth of the storage medium, both are increasing in speed year by year owing to advances in transmission technology. The data read performance of the storage device is also improved accordingly. However, the growth rate of the memory bandwidth of the CPU tends to be slower than the transfer bandwidth of the storage medium. That is, if the data compression unit is increased, the memory bandwidth of the CPU may become a bottleneck in reading the data of the storage device, to hinder performance improvement.

The storage device of one aspect of the present invention includes a first memory, a process device that stores data in the first memory and reads the data from the first memory, and an accelerator that includes a second memory different from the first memory. The accelerator stores compressed data stored in one or more storage drives storing data, in the second memory, decompresses the compressed data stored in the second memory to generate plaintext data, extracts data designated in the process device from the plaintext data, and transmits the extracted designated data to the first memory.

SUMMARY OF THE INVENTION

According to an aspect of the present invention, the performance of the storage device that reduces an amount of stored data by lossless compression can be improved.

BRIEF DESCRIPTION OF THE DRAWINGS

FIG. 7 illustrates transmission amount comparison with the related art according to an example of the data reading of the first embodiment;

FIG. 14 illustrates a flowchart of the data reading procedure of the third embodiment.

DESCRIPTION OF EMBODIMENTS

Figure 1:
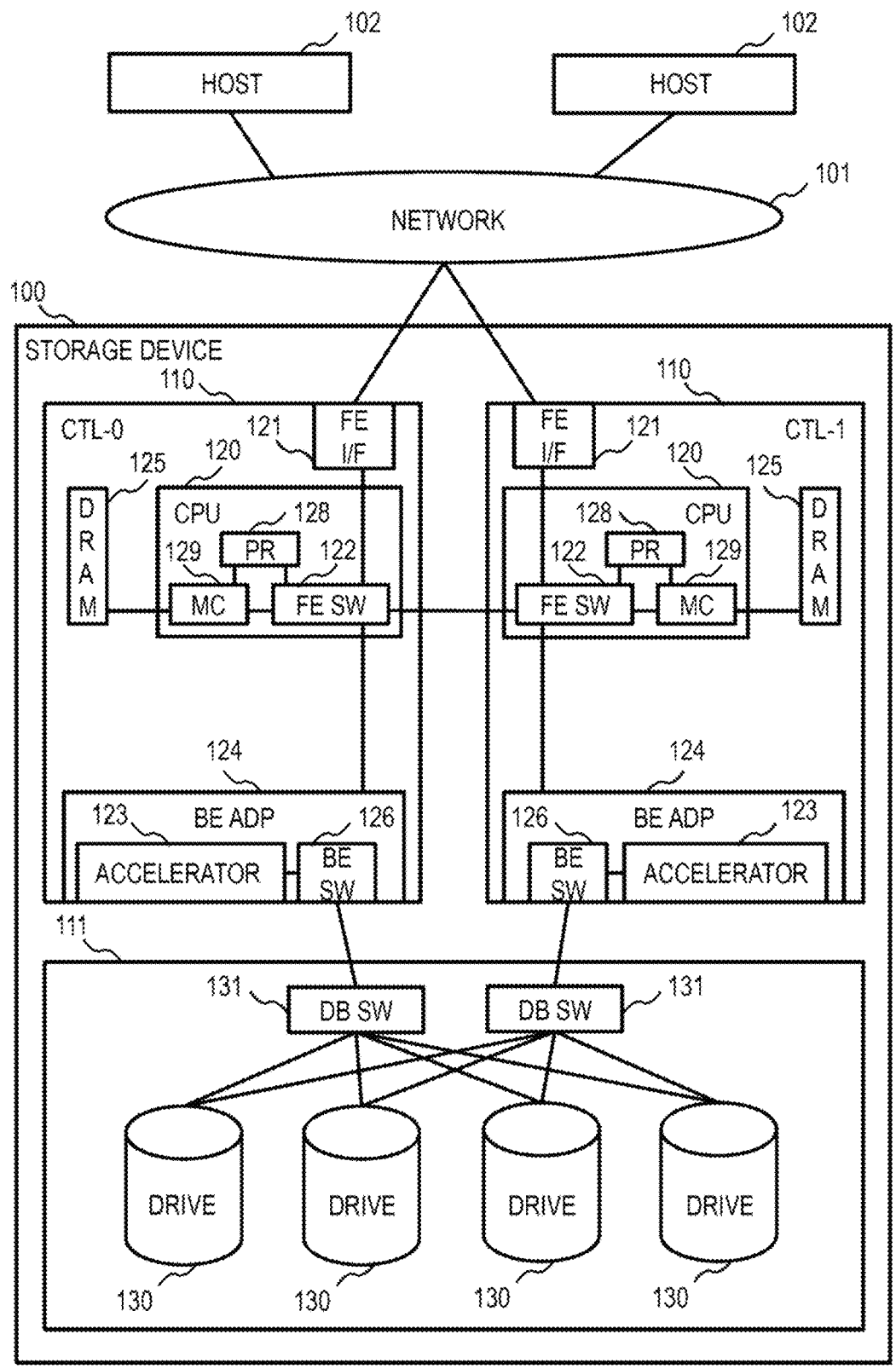
FIG. 1 illustrates a configuration of a system of a first embodiment.

Hereinafter, embodiments of the present invention are specifically described with reference to the drawings. In the following description, the same configuration is denoted by the same reference numerals in principle, and repeated descriptions are omitted. It should be noted that the embodiments described below are merely examples for embodying the present invention and do not limit the technical scope of the present invention.

First Embodiment (1) System Configuration

With reference to FIG. 1, a storage device 100 having a data amount reduction function using lossless compression according to a first embodiment and a system configuration including the storage device are described. A plurality of hosts 102 are connected to the storage device 100 via a network 101. The hosts 102 each perform various requests such as a read request or a write request (I/O request) on the storage device 100 via the network 101 for managing data.

The storage device 100 has a data amount reduction function by using lossless compression. The storage device 100 is equipped with two storage controllers (CTL) 110 having the same function for high reliability and equipped with a drive box 111 including a plurality of storage drives 130 (simply referred to as drives 130) as storage media storing data. The drive box 111 includes the drives 130 and a housing that accommodates the drives 130. In the present embodiment, an example in which two storage controllers 110 are provided is described, but the present embodiment is not limited to this number of the controllers. For example, the storage device may be equipped with three or more storage controllers 110.

The drives 130 are a non-volatile storage medium such as a hard disk drive (HDD) or a solid state drive (SSD). According to the present embodiment, the drive 130 is not limited to the HDD or the SSD.

The storage controller 110 is equipped with components inside thereof, such as a processor (PR) 128 that performs various kinds of control of the storage device, a memory controller (MC) 129, a front end (FE) switch 122, a dynamic random access memory (DRAM) 125, a front-end interface 121 (hereinafter, referred to as an FE_I/F 121), a back-end adapter 124 (hereinafter, referred to as a BE_ADP 124).

The CPU 120 is a semiconductor chip that includes the processor 128, the memory controller 129, and the FE switch 122. The BE_ADP 124 includes the BE switch 126 and an accelerator 123 connected thereto.

Each component except for the DRAM 125 is connected to each other via the FE switch 122. The standard for this interconnection interface is, for example, PCI-Express. According to the present embodiment, the connection interface in the storage controller 110 is not limited to PCI-Express.

The DRAM 125 is a first memory and is connected to the memory controller 129 of the CPU 120. The CPU 120 that is a process device connected to the DRAM 125 stores data in the DRAM 125 and reads data from the DRAM 125. The standard that this connection interface follows is, for example, Double Data Rate 4 (DDR4). According to the present embodiment, the standard of the connection interface of the DRAM 125 is not limited to DDR4.

The DRAM 125 is a volatile storage medium, and provides a temporary storage area that functions as a cache or a buffer of the data in the storage device 100. Both of the volatile storage medium and the non-volatile storage medium are computer-readable non-transient storage media.

The FE_I/F 121 is an interface for connection with a plurality of hosts that sends various requests to the storage devices, and a protocol such as Fibre Channel (FC) or Ethernet can be used. According to the present embodiment, a protocol used by the FE_I/F 121 is not limited to FC or Ethernet.

The BE_ADP 124 is an interface for connection to the drive box 111 including the plurality of drives 130 mounted on the storage device 100. The BE_ADP 124 is an interface for writing data to the drive box 111 and reading data from the drive box 111. The BE_ADP 124 uses a protocol such as Serial Attached SCSI (SAS), Serial ATA (SATA), and NVM Express (NVMe). According to the present embodiment, the protocol used by the BE_ADP 124 is not limited to SAS, SATA, and NVMe.

The accelerator 123 is a characteristic component of the present embodiment, and is hardware that compresses and decompresses data at high speed with the storage controller 110. The accelerator 123 is hardware that executes compression and decompression processes at high speed instead of the CPU 120 of the storage controller 110. According to the present embodiment, an example in which one storage controller 110 is equipped with one accelerator 123 is described, but the present embodiment is not limited to this number of components. For example, one storage controller 110 may be equipped with two accelerators 123. Details of the accelerators 123 are provided with reference to FIG. 2.

The CPU 120 or the drive 130 is connected to the accelerator 123 via the BE switch 126, transmits data, and receives control information.

The storage device 100 collects the plurality of drives 130 and manages the drives as one storage area, to provide an area for storing data to the hosts 102. At this point, data is secured by performing redundancy using the Redundant Arrays of Inexpensive Disks (RAID) technology so that data is not lost due to a partial failure of the drive 130.

The drive box 111 includes two drive box switches (hereinafter, referred to as DB_SWs 131) for establishing for data transmission paths respectively to the plurality of drives 130 from the two storage controllers 110. The DB_SWs 131 bundle the data transmission paths between the plurality of drives 130 and the CPUs 120. The drives 130 each have the transmission paths from the two DB_SWs 131, respectively, so that data can be continuously read and written even if any one of the two storage controllers 110 breaks down. According to the present embodiment, the number of DB_SWs 131 is not limited to two.

(2) Accelerator Configuration

Figure 2:
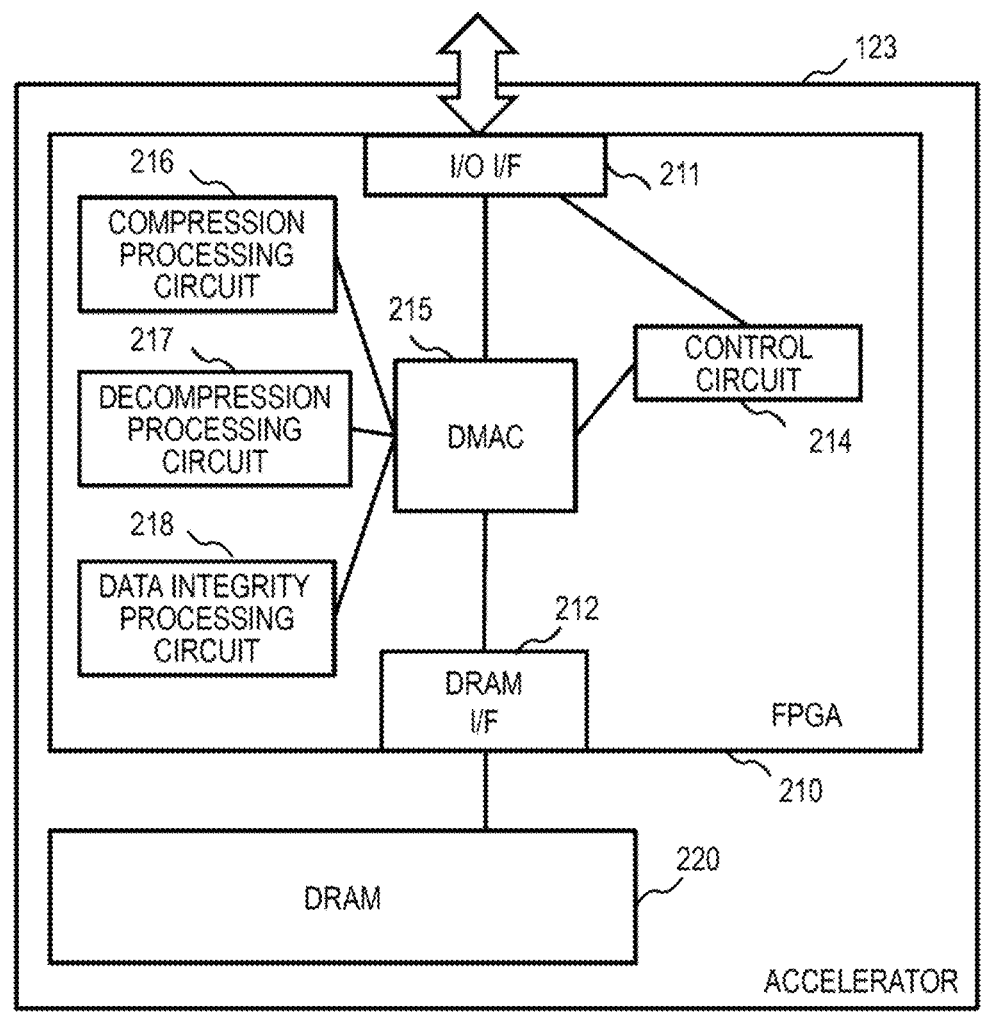
FIG. 2 illustrates an internal configuration of a compression decompression accelerator of the first embodiment.

With reference to FIG. 2, the internal configuration of the accelerator 123 is described. The accelerator 123 includes a field programmable gate array (FPGA) 210 which is a data process circuit and a DRAM 220 inside thereof.

The DRAM 220 is a volatile storage medium in the same manner as the DRAM 125, but is a second memory that is not connected to the CPU 120, differently from the DRAM 125. The DRAM 220 is in the accelerator 123 and provides a temporary storage area of compressed data or plaintext data. The present embodiment is not limited to a configuration in which the DRAM 220 and the DRAM 125 are the same volatile storage medium.

The FPGA 210 is a device on which an arbitrary logic circuit can be hardware-installed in a programmable manner. The FPGA 210 includes a compression process circuit 216, a decompression process circuit 217, a data integrity process circuit 218, an I/O interface 211, a DRAM interface 212, a control circuit 214, and a direct memory access controller (DMAC) circuit 215, inside thereof.

According to the present embodiment, instead of the FPGA 210, an application specific integrated circuit (ASIC) in which a logic circuit is fixedly hardware-installed may be provided. The FPGA (or ASIC) 210 may be configured with one semiconductor chip or may be configured with the plurality of semiconductor chips connected to each other. Further, logic circuits to be installed on each semiconductor chip are arbitrarily selected.

The DMAC 215 is connected to the compression process circuit 216, the decompression process circuit 217, the data integrity process circuit 218, the I/O interface 211, the DRAM interface 212, and the control circuit 214 in the FPGA 210. The DMAC 215 transmits the data between the components by addresses or identifiers (ID). In FIG. 2, an aspect in which components are connected in a star shape is described, but in the present embodiment, the connection is not limited to this.

The compression process circuit 216 is a logic circuit that compresses plaintext data by a lossless compression algorithm and generates compressed data. The compression process circuit 216 can process the compression at higher speed than the processor 128 of the CPU 120.

The decompression process circuit 217 is a logic circuit that decompresses the compressed data by the lossless compression algorithm and generates plaintext data. The decompression process circuit 217 can process the decompression at higher speed than the processor 128 of the CPU 120.

The data integrity process circuit 218 is a logic circuit that generates a cyclic redundant code (CRC) included in the guarantee code in the compressed plaintext data, verifies the CRC included in the guarantee code in the decompressed plaintext data, and confirms that the data is not corrupted.

The I/O interface 211 is a logic circuit that is connected to the outside. The I/O interface 211 transmits and receives the data or the control information with the outside. The I/O interface 211 receives plaintext data and transmits the compressed data during the compression process. The I/O interface 211 receives the compressed data and transmits the plaintext data during the decompression process.

The control circuit 214 is connected to the I/O interface 211 and receives a process request from the CPU 120 to the accelerator 123 via the I/O interface 211. The control circuit 214 controls the DMAC 215, transmits the data between the components in the accelerator 123, and transmits the data via the I/O interface 211.

Figure 9:
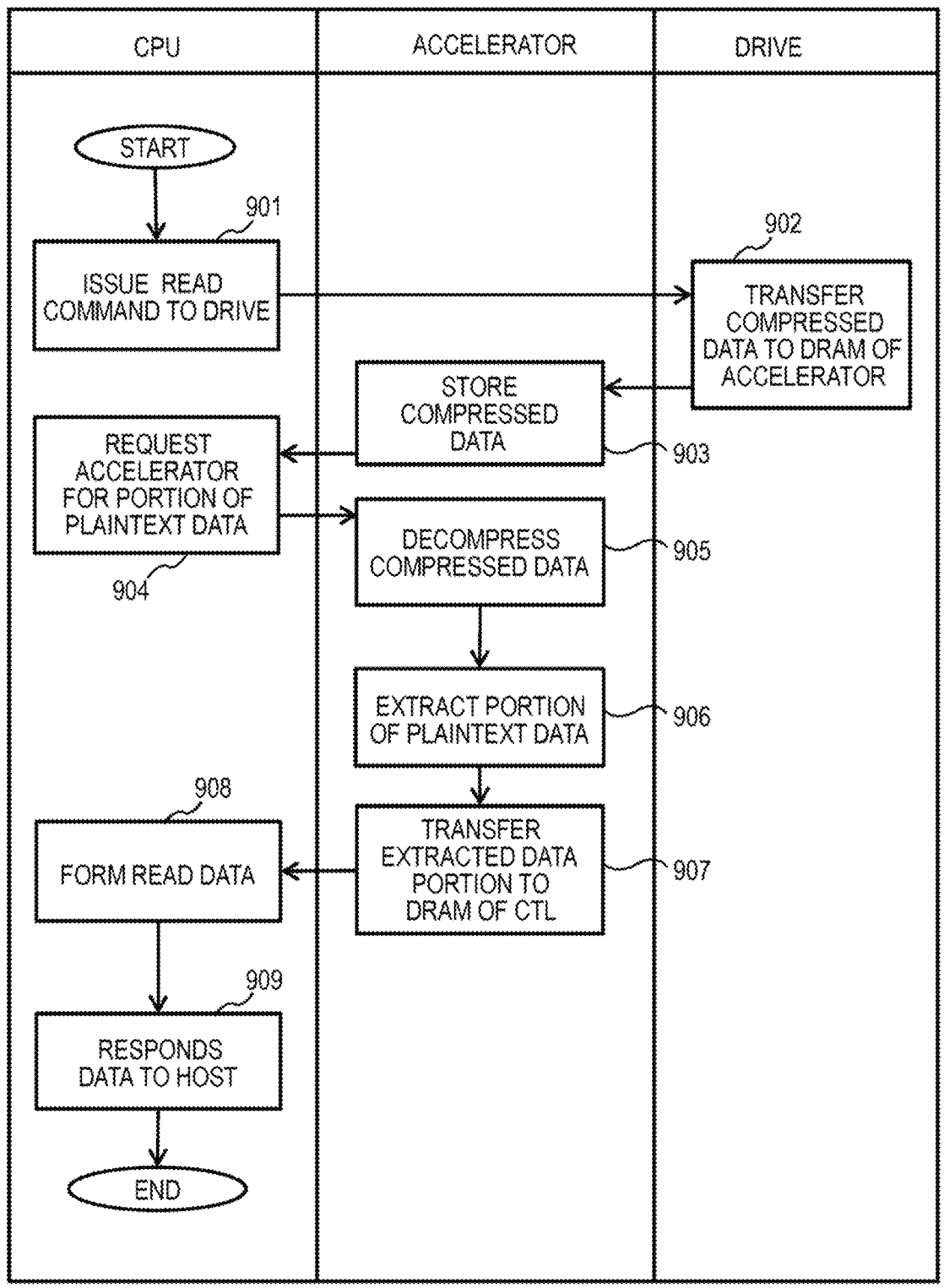
FIG. 9 illustrates a first flowchart of the data reading procedure of the first embodiment.
Figure 10:
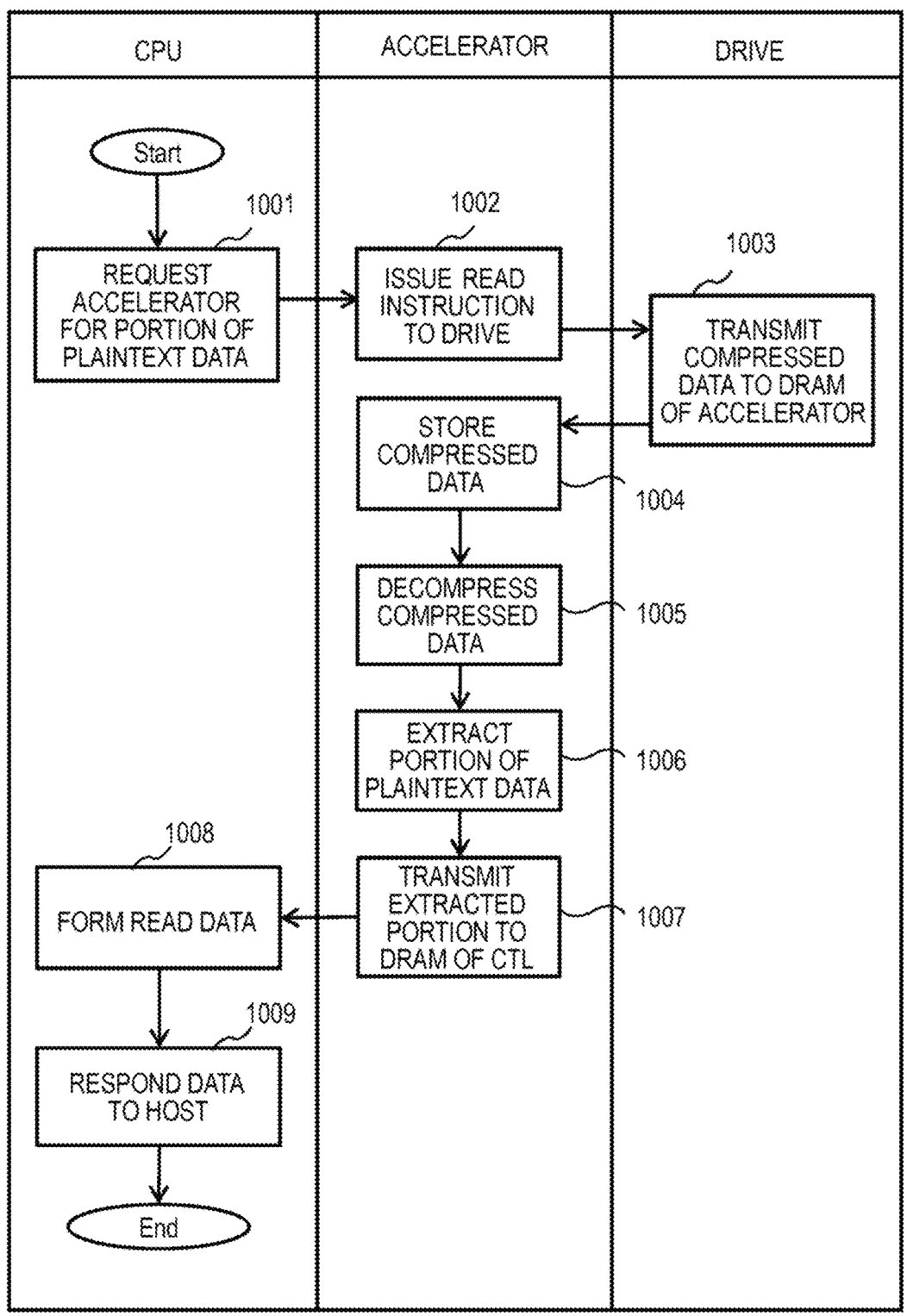
FIG. 10 illustrates a second flowchart of the data reading procedure of the first embodiment.

If a read request is received from the CPU 120, the control circuit 214 issues a read instruction to the drive 130 according to a request parameter (this operation is not performed in the flow of FIG. 9 but performed in the flow of FIG. 10).

For example, the request parameter indicates an address of target data to be read from the drive 130, an internal address of a portion to be extracted from the target data, and a transmission destination of the extracted portion.

The DMAC 215 stores the target data received from the drive 130 to the DRAM 220. The control circuit 214 instructs the compression process circuit 216, the decompression process circuit 217, and the data integrity process circuit 218 to respectively perform the compression process, the decompression process, and the guarantee code process with respect to the target data, and to transmit the process results to the DRAM 220.

Also, the control circuit 214 extracts a portion of the process result data in the DRAM 220 according to the request parameter received from the CPU 120, and transmits the extracted portion to the DRAM 125 via the I/O interface 211. The control circuit 214 monitors the other components of the FPGA 210 for failure according to periodic information monitoring and an interruption process.

The DRAM interface 212 is an interface for the FPGA 210 reading and writing the data of the DRAM 220. The standard followed by the interface is, for example, DDR4. According to the present embodiment, the standard of the connection interface of the DRAM 220 is not limited to DDR4.

The number of channels of the DRAM interface 212 is designed to calculate internal transmission throughput requirements of the compressed data or the plaintext data based on the read and write performance specification of the storage device 100 and to have a sufficient bandwidth according to this. That is, according to the transmission of the compressed data or the plaintext data, the number of channels is designed so that the bandwidth of the DRAM interface 212 does not become a bottleneck. As the throughput requirement is higher, the number of channels becomes larger. The FPGA 210 is programmable, and thus has a high degree of freedom in design, compared with a case where the maximum number of channels between the CPU 120 and the DRAM 125 is fixed by the specification of the CPU 120.

(3) Compression Unit and Data Structure

Figure 3A:
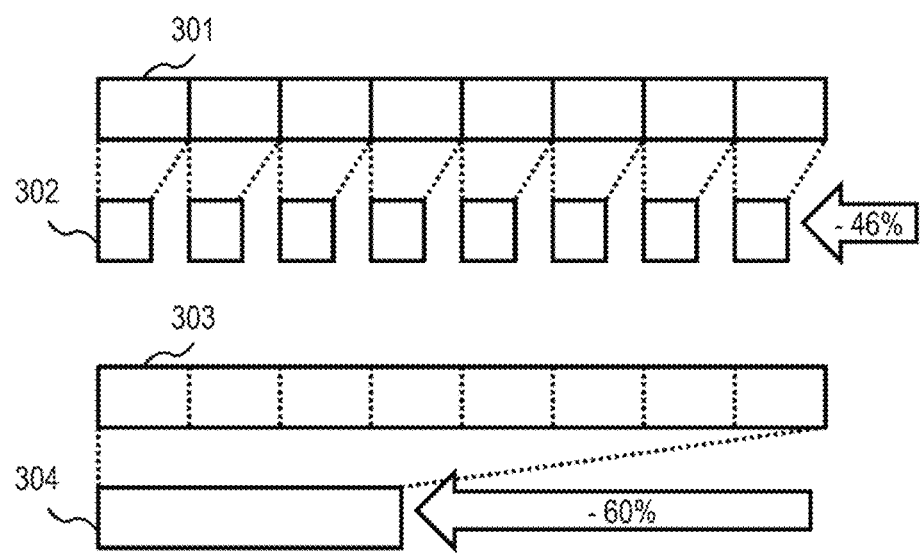
FIG. 3A illustrates an expansion effect of a data compression unit of the first embodiment.
Figure 3B:
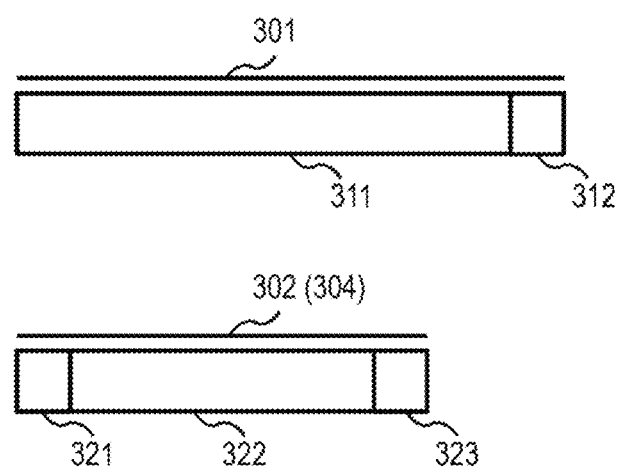
FIG. 3B illustrates structures of plaintext data and compressed data according to the first embodiment.
Figure 8:
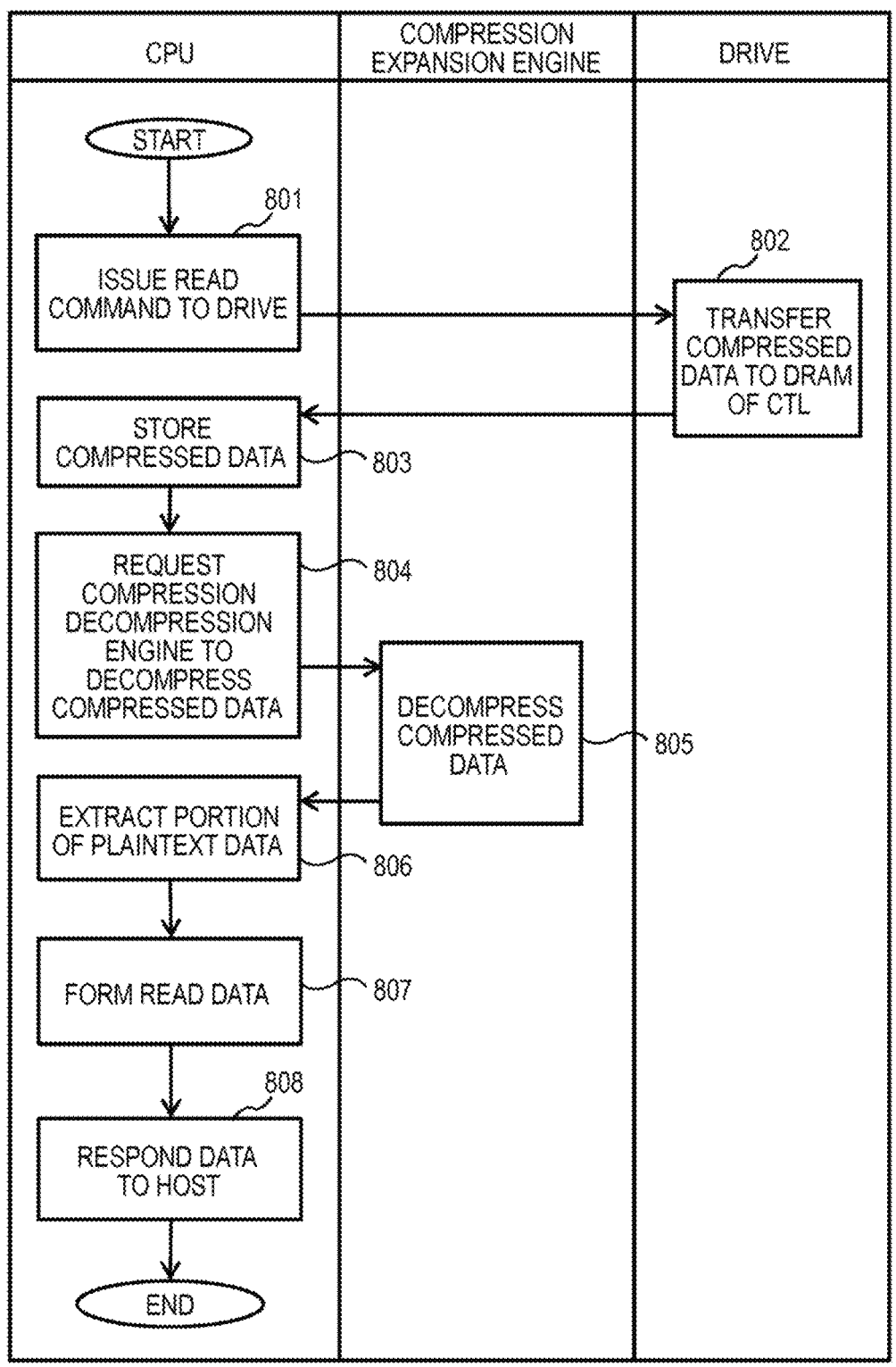
FIG. 8 illustrates a flowchart of a data reading procedure of a comparative example.

With reference to FIGS. 3A and 3B, an effect of expanding a compression unit and structures of the plaintext data and the compressed data are described. In FIG. 3A, 8 kB plaintext data 301 is a minimum unit of the data transmitted by the storage device 100 between the hosts 102 and the storage device 100 by the read/write request from the outside. If the 8 kB plaintext data is individually compressed, for example, 46% of the data amount is reduced from the 8 kB plaintext data 301 in average.

Meanwhile, 64 kB data 303 is data configured by connecting eight items of the 8 kB data 301. If the 64 kB data 303 is compressed, for example, 60% of the data amount is reduced from the 64 kB plaintext data 303 in average. In this manner, if the compression unit is increased, the compression rate is improved. The storage device 100 of the present embodiment causes the compression unit to 64 kB larger than 8 kB in the related art to increase the data reduction rate so that the data storage cost can be reduced.

FIG. 3B illustrates a data structure of the plaintext data 301 and compressed data 302 (304). The plaintext data 301 includes a payload 311 which is net data stored by the host 102 in the storage device 100 and a guarantee code 312 corresponding thereto. The guarantee code 312 includes a storage destination address and the CRC of the payload 311. The storage controller 110 inspects whether there is an error in the storage destination address or whether the data content is corrupted according to the guarantee code 312. The storage destination address is an address for identifying a position in the address space where the host 102 reads and writes the data, and is not an address of the drive 130.

The compressed data 302 (304) includes a result obtained by compressing the plaintext data 301 (or a result obtained by compressing the plaintext data 303 in which eight items of the plaintext data 301 are arranged) 322, header information 321, and a guarantee code 323. The header information 321 includes the size of a compression result 322. The guarantee code 323 includes the storage destination address or the CRC of the compression result 322. The storage controller 110 inspects whether there is an error in the storage destination address or whether the data content is corrupted, according to the guarantee code 323. The storage destination address is an address used by the storage controller 110 for identifying the position in the address space configured with the plurality of drives 130.

The data integrity process circuit 218 in the accelerator 123 generates and inspects the CRC in the guarantee code 312 or 323 when the compression and decompression processes are performed.

(4) Extraction of Read Data

Figure 4:
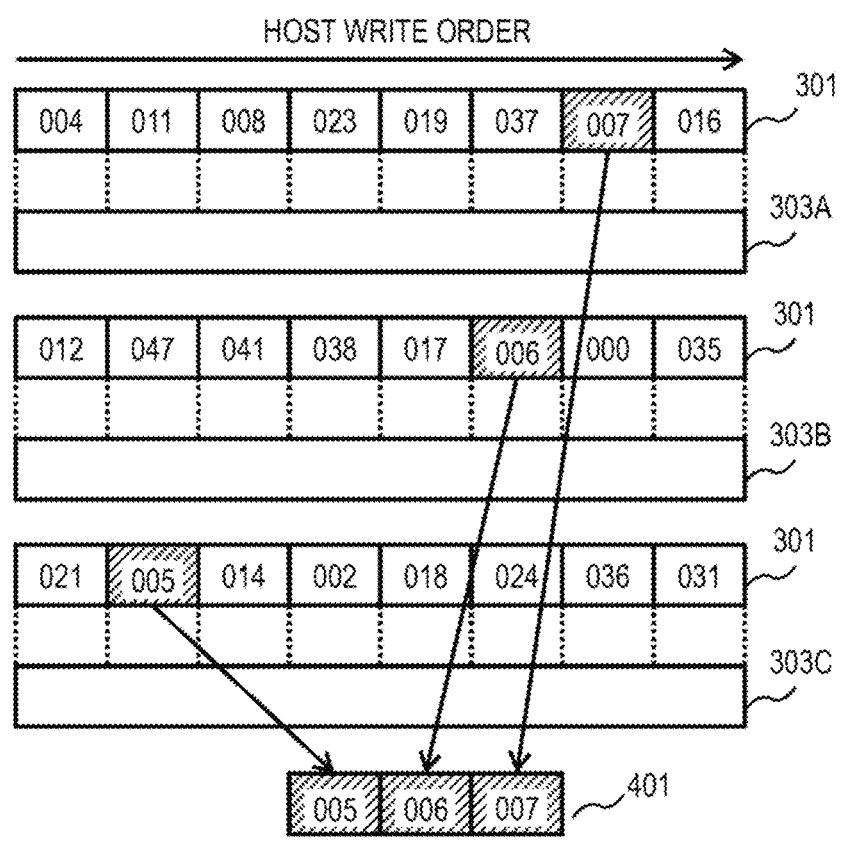
FIG. 4 illustrates an extraction example of read data of the first embodiment.

With reference to FIG. 4, a method in which the storage controller 110 configures the read request data from the host 102 is described.

It is likely that the host 102 writes the 8 kB plaintext data 301 to the storage device 100 in a random address order. In this case, the storage controller 110 configures the 64 kB plaintext data 303 whenever eight items of the 8 kB plaintext data 301 are stored in the DRAM 125 in a writing order.

FIG. 4 illustrates an example in which 24 items of the 8 kB plaintext data 301 are written in a random address order, and each of three items of the 64 kB plaintext data 303A, 303B, and 303C is configured with a set of eight items of the 8 kB plaintext data 301. One item of 8 kB plaintext data in each set including eight items of the 8 kB plaintext data 301 is indicated by reference numeral 301, as an example. A number in a square rectangle indicating the 8 kB plaintext data 301 is an address for identifying a position in the address space where the host 102 reads and writes data. The storage controller 110 individually compresses three items of 64 kB plaintext data and stores the compressed data in the drive 130.

Thereafter, it is likely that the host 102 reads the 8 kB plaintext data 301 from the storage device 100 in a sequential address order. FIG. 4 illustrates an example in which the host 102 reads sequential 24 kB plaintext data 401 that includes three items of the 8 kB plaintext data 301 and in which addresses are in order of 005, 006, and 007.

In the example of FIG. 4, the storage controller 110 reads three items of the 64 kB compressed data 304 obtained by respectively compressing the three items of the 64 kB plaintext data 303A, 303B, and 303C, from the drive 130. The storage controller 110 decompresses each of the three items of the 64 kB compressed data 304 and restores the three items of the 64 kB plaintext data 303A, 303B, and 303C. The storage controller 110 extracts three items of the 8 kB plaintext data 301 of which the addresses are 005, 006, and 007 from the plaintext data, and configures the read data 401 requested by the host 102.

If the compression unit is 8 kB, the storage controller 110 reads the data obtained by compressing the three items of the 8 kB plaintext data 302 from the drive 130 and decompresses the data, respectively. The storage controller 110 configures the read data 401 requested by the host 102 with the three items of the 8 kB plaintext data 301.

That is, if the compression unit is expanded, as described above, when the host 102 accesses the drives 130 for writing the data in a random address order and then sequentially reading the data, it is required that the storage controller 110 reads and decompresses a lot of data from the drive 130. Accordingly, the bandwidth consumption of the data transmission path in the storage controller 110 increases, and thus it is likely that the transmission bandwidth becomes a bottleneck, to deteriorate the performance of the storage device 100.

(5) Data Reading Procedure

Figure 5:
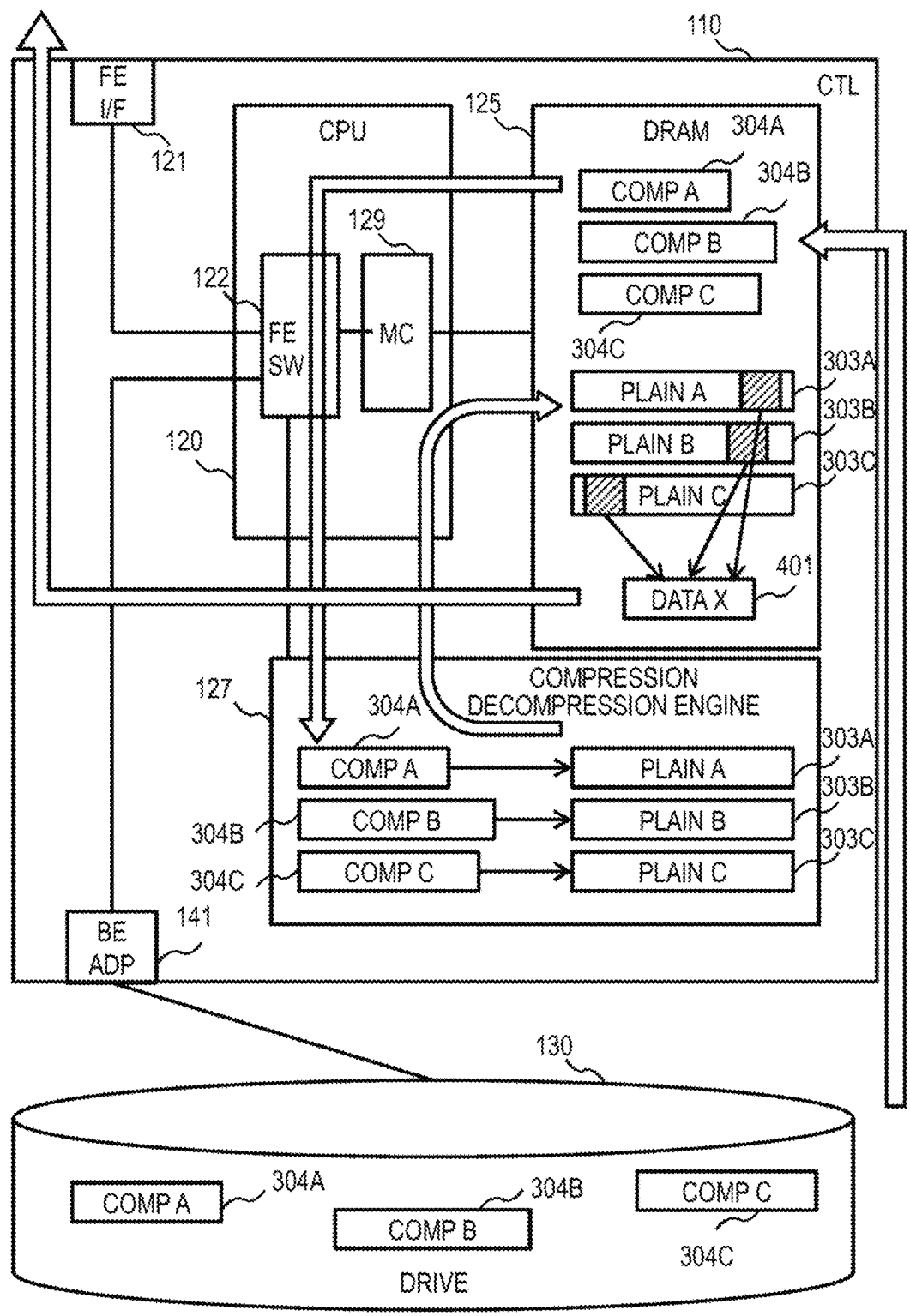
FIG. 5 illustrates an outline of a data reading procedure of a comparative example.
Figure 6:
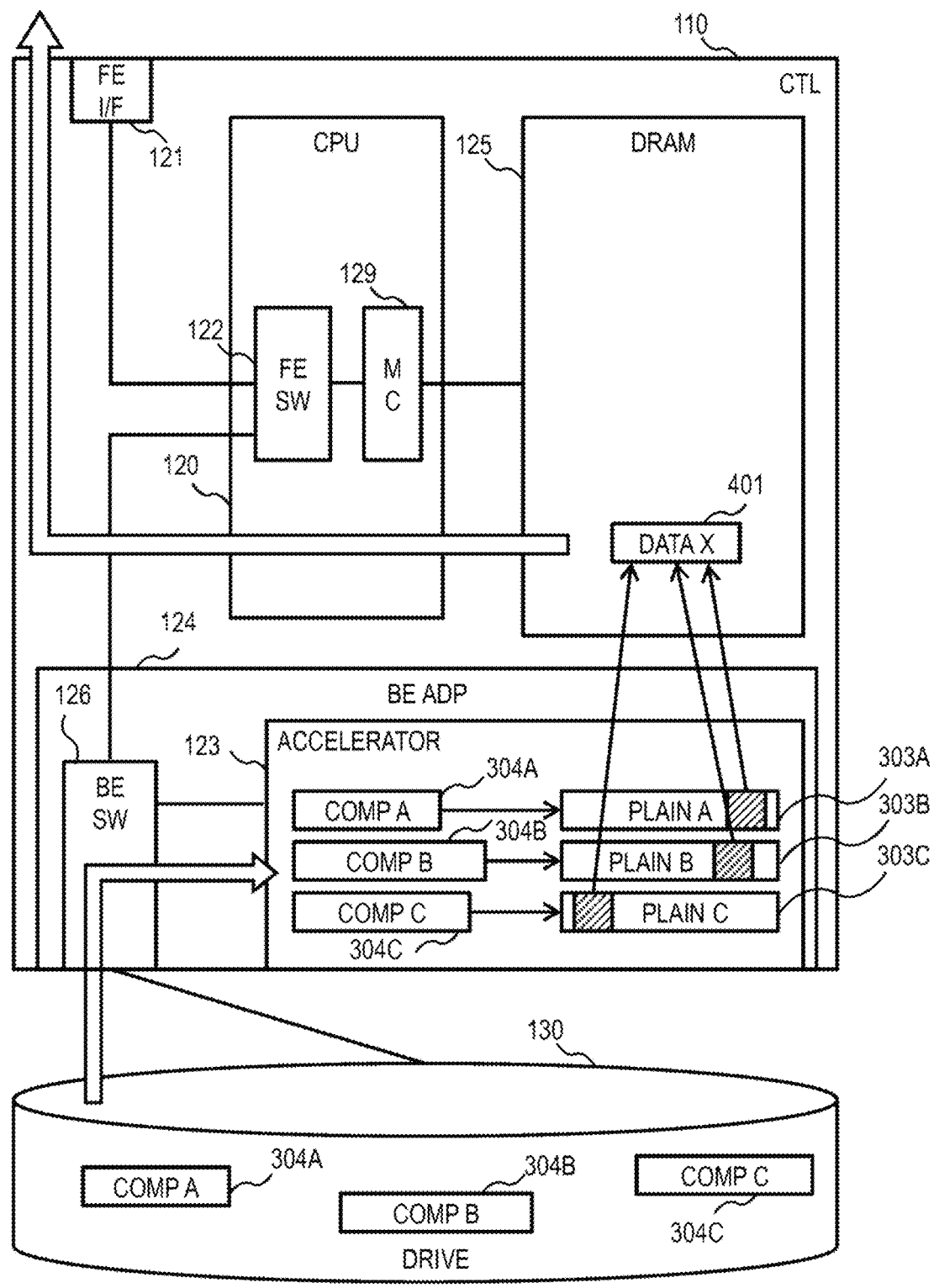
FIG. 6 illustrates an outline of the data reading procedure of the first embodiment.

With respect to FIGS. 5 and 6, data reading procedures according to a comparative example and the present embodiment are described. FIG. 5 illustrates a data reading procedure when the compression unit is expanded in a storage device of the comparative example. Compared with the storage device 100 of the present embodiment illustrated in FIG. 1, a compression decompression engine 127 connected to the FE switch 122 is added. In addition, differently from the BE_ADPs 124 illustrated in FIG. 1, a BE_ADP 141 does not include an accelerator. In the same manner as the accelerators 123 illustrated in FIG. 1, the compression decompression engine 127 is hardware that executes compression and decompression of the data at high speed. The compression decompression engine 127 receives an input of the data from the DRAM 125 according to the process instruction of the processor 128, compresses or decompresses the data, and outputs the data to the DRAM 125.

In FIG. 5, the CPU 120 reads three items of 64 kB compressed data (Comp_A (304A), Comp_B (304B), and Comp_C (304C)) from the drive 130 to the DRAM 125 via the BE_ADP 141, the FE_SWs 122, and the memory controllers 129. Subsequently, the CPU 120 transmits three items of the 64 kB compressed data 304A, 304B, and 304C from the DRAM 125 to the compression decompression engine 127 via the memory controller 129 and the FE_SW 122 and instructs decompression thereof.

The compression decompression engine 127 decompresses three items of the 64 kB compressed data 304A, 304B, and 304C and generates three items of the 64 kB plaintext data (Plain_A (303A), Plain_B (303B), and Plain_C (303C)). The compression decompression engine 127 transmits three items of the 64 kB plaintext data 303A, 303B, and 303C to the DRAM 125 via the FE_SW 122 and the memory controller 129.

The CPU 120 extracts three items of 8 kB plaintext data from these, configures the read data (Data_X (401)) requested by the host 102, and stores the read data in the DRAM 125. The CPU 120 responds to the host 102 with read data 181 via the memory controller 129, the FE_SW 122, and the FE_I/F 121.

FIG. 6 illustrates a data reading procedure when the compression unit is expanded according to the present embodiment. The CPU 120 reads three items of 64 kB compressed data (Comp_A (304A), Comp_B (304B), and Comp_C (304C)) from the drive 130 to the DRAM 220 in the accelerator 123 via the BE_SW 126 of the BE_ADP 124. In this manner, the compressed data 304A, 304B, and 304C stored in the drive 130 are transmitted to the DRAM 220 without the DRAM 125.

Subsequently, the accelerator 123 decompresses three items of the 64 kB compressed data 304A, 304B, and 304C and stores three items of the 64 kB plaintext data (Plain_A (303A), Plain_B (303B), and Plain_C (303C)) to the DRAM 220. The accelerator 123 extracts three designated items of the 8 kB plaintext data from three items of the 64 kB plaintext data 303A, 303B, and 303C and transmits the extracted data to the DRAM 125 via the FE_SW 122 and the memory controller 129. The CPU 120 configures the read data (Data_X (401)) requested by the host 102 from three items of the 8 kB plaintext data and responds to the host 102 via the FE_SW 122 and the FE_I/F 121.

(6) Comparison of Transmission Amount in Data Reading

With reference to FIG. 7, in the data reading according to the comparative example and the present embodiment, amounts of the data transmitted in the storage device 100 are compared. Table 700 of FIG. 7 shows an example of transmission directions and data amounts (unit of kB) of the data passing through each component inside the storage device 100, when the storage device 100 responds with the three items of 8 kB plaintext data illustrated in FIG. 4 according to the read request of the host 102.

A column 701 shows component names, and a column 702 shows transmission directions (input, output, transmission sources, or transmission destinations). A column 703 shows transmission data amounts when the compression unit is 8 kB with respect to the data reading of the comparative example illustrated in FIG. 5. A column 704 shows a transmission data amount when the compression unit expands to 64 kB with respect to the data reading of the comparative example. A column 705 shows a transmission data amount when the compression unit expands to 64 kB with respect to the data reading of the present embodiment. In Table 700, the data amount of a portion of cells is shown as the sum of three values, and each value shows the data size of the data (compressed or plaintext data) of the compression unit.

In this example, it is assumed that the 8 kB plaintext data 301 with the addresses 005, 006, and 007 is compressed by 46% in average by the compression, to be 4 kB, 5 kB, and 4 kB. It is assumed that the 64 kB plaintext data 303A, 303B, and 303C respectively including 8 kB data with the addresses 005, 006, and 007 are compressed by 60% in average by compression to be 20 kB, 30 kB, and 26 kB, respectively.

A flow of the data of the comparative example shown by the column 703 is described. The three items of 8 kB compressed data are stored from the drive 130 in the DRAM 125 via the BE_ADP 141, the FE_SW 122, and the memory controller 129 (rows "1", "8", and "9"). The three items of 8 kB compressed data are transmitted from the DRAM 125 to the compression decompression engine 127 via the memory controller 129 and the FE_SW 122 (rows "10", "11", and "12").

The three decompressed items of 8 kB plaintext data are transmitted from the compression decompression engine 127 to the DRAM 125 via the FE_SW 122 and the memory controller 129 (rows "13", "14", and "15"). If the read data formed from the three items of 8 kB plaintext data is transmitted from the DRAM 125 to the host 102 via the memory controller 129, the FE_SW 122, and the FE_I/F 121 (rows "18" and "19").

Subsequently, a flow of the data of the comparative example shown by the column 704 is described. The three items of 64 kB compressed data are stored from the drive 130 in the DRAM 125 via the BE_ADP 141, the FE_SW 122, and the memory controller 129 (rows "1", "8", and "9"). The three items of 64 kB compressed data are transmitted from the DRAM 125 to the compression decompression engine 127 via the memory controller 129 and the FE_SW 122 (rows "10", "11", and "12").

The three decompressed items of 64 kB plaintext data are transmitted from the compression decompression engine 127 to the DRAM 125 via the FE_SW 122 and the memory controller 129 (rows "13", "14", and "15"). Three items of 4 kB plaintext data are extracted from the three items of 64 kB plaintext data, and read data is configured (rows "16" and "17"). The formed read data is transmitted from the DRAM 125 to the host 102 via the memory controller 129, the FE_SW 122, and the FE_I/F 121 (rows "18" and "19").

Subsequently, a flow of the data of the present embodiment shown by the column 705 is described. The three items of 64 kB compressed data are transmitted to the DRAM 220 in the accelerator 123 via the BE_SW 126 of the BE_ADP 124 (rows "1" and "2"). The three items of 64 kB compressed data are transmitted from the DRAM 220 to the FPGA 210 in the accelerator 123 (rows "3" and "4").

Subsequently, the three decompressed items of 64 kB plaintext data are transmitted from the FPGA 210 to the DRAM 220 in the accelerator 123 (rows "5" and "6"). The three items of 8 kB plaintext data extracted from the three items of 64 kB plaintext data are transmitted from the DRAM 220 to the DRAM 125 via the FE_SW 122 and the memory controller 129 (rows "7", "8", and "15"). The read data is configured from the three items of 8 kB plaintext data transmitted from the DRAM 125 to the CPU 120 (row "18") and transmitted to the host 102 via the FE_SW 122 and the FE_I/F 121 (row "19").

The sum of the data amounts that are input and output to the DRAM 220 in the accelerator 123 is shown on the third row from the bottom of Table 700. The sum of the data amounts that are input and output to the DRAM 125 is shown on the second row from the bottom. In the comparative example, if the compression unit is expanded, as illustrated in the column 704, the data amount that is input and output to the DRAM 125 extremely increases from 48 kB to 416 kB.

As illustrated in the column 705, according to the present embodiment, even if the compression unit is expanded, the data amount that is input and output to the DRAM 125 is 48 kB, as it is. However, the data amount that is input and output to the DRAM 220 is 368 kB. Since 48+368=416, also in the procedure of the present embodiment, the sum of the data amounts that are input and output to the DRAM is the same as that in the procedure in the related art, but the increase of the data amount that is input and output to the DRAM 125 connected to the CPU 120 can be suppressed.

For example, it is assumed that, in order to respond with the three items of the 8 kB plaintext data 301 for the period of time requested by the host 102, the data amount is required to be 200 kB or lower with the number of channels of the memory controller 129 included in the CPU 120. The increase of the input and output data amount to 416 kB due to the expansion of the compression unit means that the DRAM transmission becomes a bottleneck, and the read performance of the storage device 100 is deteriorated.

Meanwhile, according to the present embodiment, as described with reference to FIG. 2, the accelerator 123 includes an interface for causing the FPGA 210 to read and write data from and to the DRAM 220, and thus the number of channels can be designed in a programmable manner. For example, if the DRAM interface 212 of the FPGA 210 in the accelerator 123 is logic-designed so that the memory controller 129 included in the CPU 120 includes channels by two times of the number of channels, the performance is not deteriorated to the data amount of 400 kB.

Therefore, even if the input and output data amount of the DRAM 220 by the expansion of the compression unit becomes 368 kB, the DRAM transmission does not become a bottleneck, and the read performance of the storage device 100 is not deteriorated. Also in the case where hardware different from the FPGA, for example, the ASIC is used, the number of channels with the DRAM 220 can be designed independently from the CPU 120, and thus the same effect can be achieved.

The first row from the bottom of Table 700 shows the sum of the data amounts input and output to the DRAM 125 via the FE_SW 122. The compression of 8 kB unit of the comparative example is 74 kB, and the data amount increases to 368 kB with the compression of 64 kB unit. The data amount of the present embodiment is 48 kB, and the increase of the data amount due to the increase of the compression unit can be reduced than in the comparative example.

Since this can suppress the bandwidth consumption of the FE_SW 122 in the CPU 120, a risk that the transmission bandwidth of the FE_SW 122 becomes a bottleneck of the read performance of the storage device 100 can be also be reduced. In the above example, the read data is configured from the plaintext data obtained by decompressing three items of compressed data, but the number of the read compressed data depends on the read request from the host 102. As described above, if the plurality of items of the compressed data is decompressed respectively, and the read data is formed by extracting a portion of data, the present embodiment can achieve a greater effect than the comparative example.

(7) Flowchart of Data Reading Procedure

With reference to FIGS. 8, 9, and 10, flowcharts of the data reading procedure of the comparative example and the present embodiment are illustrated. FIG. 8 is a flowchart of the data reading procedure of the comparative example. The processes performed by the CPUs 120, the compression decompression engine 127, and the drive 130 are divided into three columns.

First, the CPU 120 issues a read instruction of the compressed data to the drive 130 (801). The drive 130 transmits the compressed data read according to the read instruction to the DRAM 125 connected to the CPU 120 (in FIG. 8, DRAM of CTL) (802). The CPU 120 stores the compressed data to the DRAM 125 (803).

Subsequently, the CPU 120 transmits the compressed data to the compression decompression engine 127 and requests decompression thereof (804). The compression decompression engine 127 decompresses the compressed data according to the decompression request (805). The plaintext data which is the decompression result is transmitted to the DRAM 125.

The CPU 120 extracts a portion of the data which is requested to read from the host 102, from the plaintext data (806) and forms read data by using the portion of the data (807). Lastly, the CPU 120 responds to the host 102 with the read data (808).

FIGS. 9 and 10 are flowcharts of the data reading procedures of the present embodiment, respectively. In the both, the processes performed by the CPU 120, the accelerator 123, and the drive 130 are divided into three columns.

Here, two kinds of examples of a method of issuing a reading instruction from the CPU 120 are shown. FIG. 9 is an example of instructing the drive 130 and the accelerator 123 individually. FIG. 10 is an example of instructing the accelerator 123 collectively.

In FIG. 9, the CPU 120 first issues the read instruction of the compressed data to the drive 130 (901). The read instruction includes a parameter indicating a read start address, a read size, and a data transmission destination of the drive 130.

The drive 130 transmits the 64 kB compressed data 304A, 340B, and 304C read according to the request parameter of Step 901 to the DRAM 220 in the designated accelerator 123 (in FIG. 9, the DRAM of the accelerator) (902). The accelerator 123 stores the 64 kB compressed data 304 in the DRAM 220 (903). The drive 130 notifies the CPU 120 of the transmission completion.

Subsequently, the CPU 120 that receives the notification of the transmission completion requests the accelerator 123 for a portion of the plaintext data (904). This request includes the start address (second address), the size, and the transmission destination of the portion of the data required for the read response to the host 102 for each item of the 64 kB plaintext data 303A to 303C.

The accelerator 123 decompresses the 64 kB compressed data 304A, 304B, and 304C according to request (905). Also, according to the request parameter of Step 904, portions of the data are extracted from each item of the 64 kB plaintext data 303A, 303B, and 303C which are decompression results (906). The accelerator 123 transmits the extracted portions of the data to the DRAM 125 connected to the CPU 120 (in FIG. 9, the DRAM of CTL) (907).

The CPU 120 forms the read data 401 by using these portions of the data (908). Lastly, the CPU 120 responds to the host 102 with the read data 401 (909). As described above, the CPU 120 instructs the drive 130 to transmit the compressed data to the DRAM 220, and the accelerator 123 receives the request including the address of the data to be extracted from the CPU 120 and extracts the designated data from the plaintext data. In the above flow, the process of the accelerator 123 is reduced, and the circuit configuration thereof can be reduced.

Meanwhile, in the flow illustrated in FIG. 10, first, the CPU 120 requests the accelerator 123 for a portion of the plaintext data (1001). The parameter of this request includes a read start address (first address) and a read size of the drive 130, a start address (second address) and a size of a portion of the data required for read response to the host 102 in the 64 kB plaintext data 303 and the transmission destination of the portion of the data.

The accelerator 123 issues the read instruction of the compressed data to the drive 130 according to the request parameter of Step 1001 (1002). The read instruction is the same as the example described with reference to FIG. 9. The drive 130 transmits the 64 kB compressed data 304A, 304B, and 304C read according to the read instruction to the DRAM 220 in the accelerator 123 (in FIG. 10, the DRAM of the accelerator) (1003). The accelerator 123 stores the 64 kB compressed data 304A, 304B, and 304C in the DRAM 220 (1004).

Subsequently, the accelerator 123 decompresses the 64 kB compressed data 304A, 304B, and 304C (1005). Also, the accelerator 123 extracts a portion of the data required for the read response to the host 102, from the 64 kB plaintext data 303A, 303B, and 303C which are the decompression results according to the request parameter of Step 1001 (1006). The accelerator 123 transmits the extracted portion to the DRAM 125 connected to the CPU 120 (in FIG. 10, the DRAM of the CTL) (1007).

The CPU 120 forms the read data 401 by using these portions of the data (1008). Lastly, the CPU 120 responds to the host 102 with the read data 401 (1009). As described above, the accelerator 123 receives the request including the start address of the compressed data stored in the drive 130 and the start address of the data extracted from the plaintext data, from the CPU 120. The accelerator 123 designates the start address of the compressed data, instructs the drive 130 to transmit the compressed data to the DRAM 220, and extracts the data from the plaintext data according to the designated start address. According to the above flow, the process of the CPU 120 decreases, so that the performance of the storage device can be increased.

Second Embodiment

Figure 11:
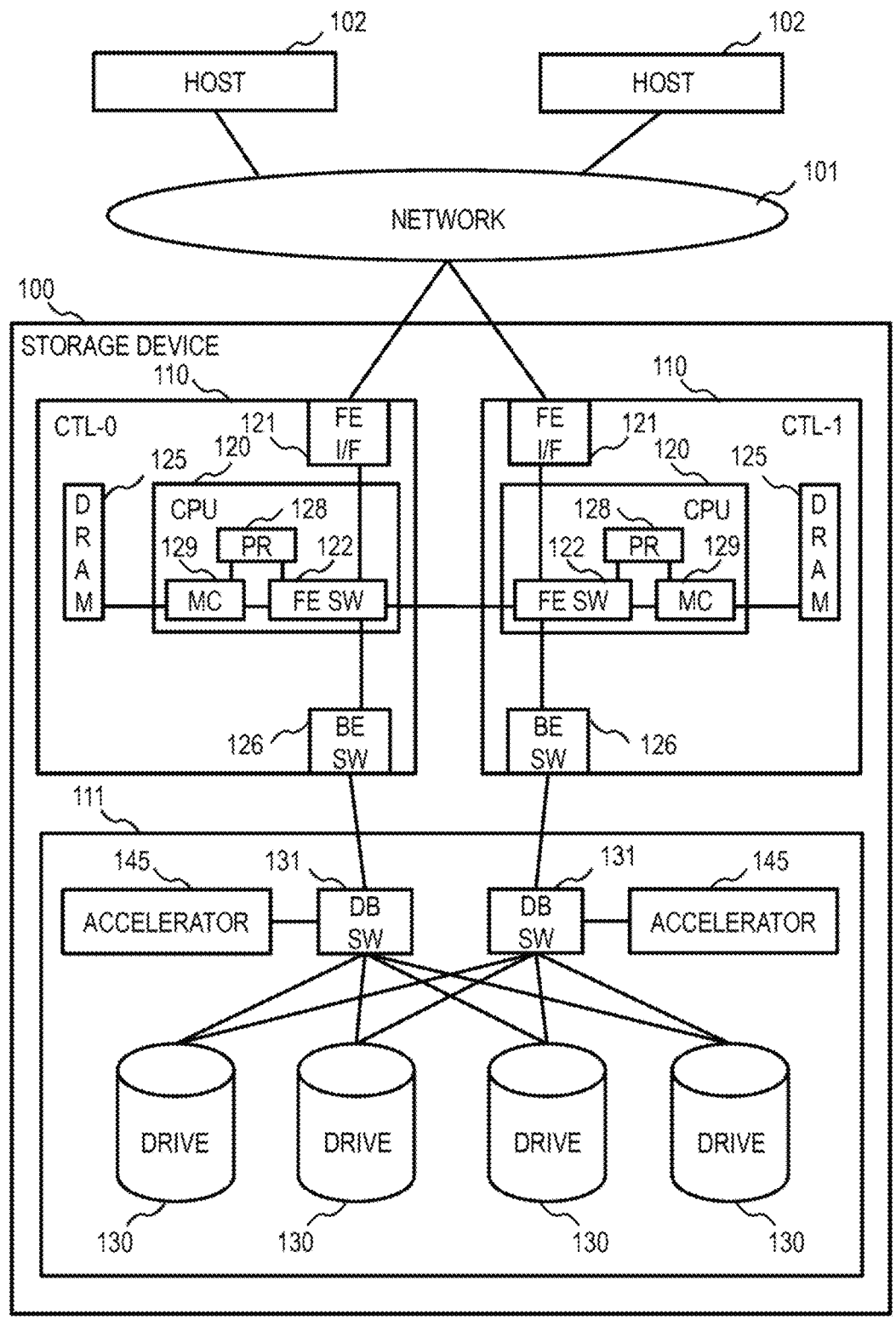
FIG. 11 illustrates a configuration of a system of the second embodiment.

With reference to FIG. 11, the storage device 100 according to a second embodiment and a system configuration including the storage device 100 are described. The differences from the first embodiment illustrated in FIG. 1 are mainly described.

According to the second embodiment, accelerators 145 are not mounted in the storage controllers 110 but are mounted in the drive box 111. In the configuration example of FIG. 11, two accelerators 145 are mounted in one drive box 111 for redundancy. The storage controllers 110 are equipped with the BE_SWs 126 instead of the BE_ADPs 124. Accelerators are not connected to the BE_SWs 126.

The two DB_SWs 131 in the drive box 111 are connected to one accelerator 145 in addition to the connection to each drive 130. For example, even if one BE_SW 126 breaks down, the driving can be maintained. The accelerator 145 of the second embodiment can perform the same operation as that of the accelerator 123 of the first embodiment.

The second embodiment is effective when the number of the drive boxes 111 (the drives 130) increases later. In the first embodiment, if the number of the drive boxes 111 is small, the performances of the accelerators 123 become excessive, and unnecessary costs may be consumed. If the number of the drive boxes 111 increases, it is likely that the performances of the accelerators 123 are insufficient. According to the second embodiment, the number of the accelerators 145 increases according to the number of the drive boxes 111 (the drives 130), unnecessary cost is suppressed, and the risk of the insufficiency of the performance of the accelerator can be reduced.

Third Embodiment

Figure 12:
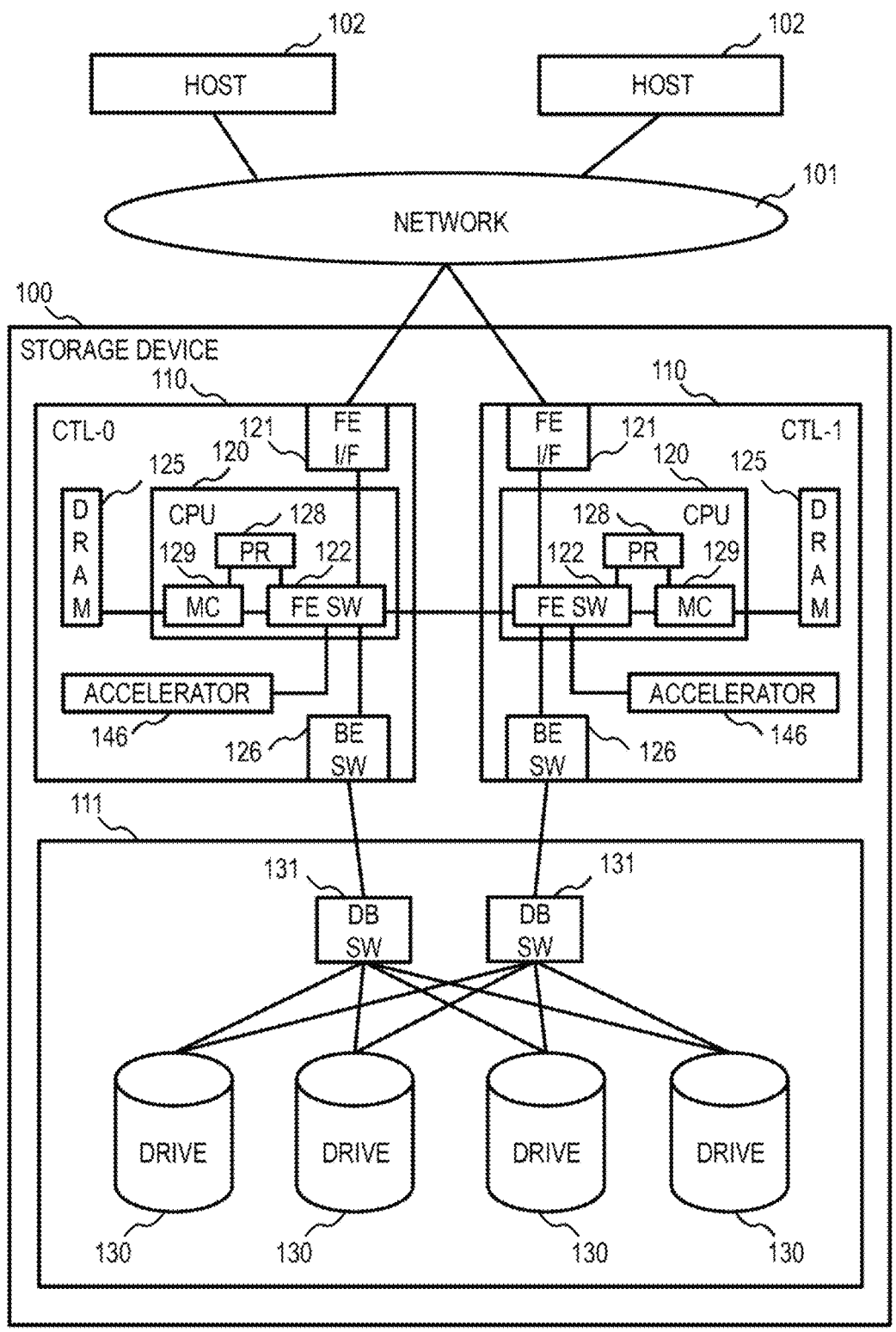
FIG. 12 illustrates a configuration of a system of a third embodiment.

With reference to FIG. 12, the storage device 100 according to a third embodiment and a system configuration including the storage device 100 are described. Differences from the first embodiment illustrated in FIG. 1 are mainly described.

According to the third embodiment, accelerators 146 are connected to the FE_SWs 122, not to BE_SWs 126 in the storage controllers 110. Differently from the accelerator 123 according to the first embodiment and the accelerator 145 according to the second embodiment, the accelerator 146 does not have a function of reading data directly from the drive 130. However, the accelerator 146 has the same internal configuration as that of the accelerator 123 illustrated in FIG. 2. The accelerators 146 may be connected to the BE_SWs 126.

According to the third embodiment, it is not required to perform access control to the drive 130 by the accelerator 146, and thus the third embodiment is more effective than the first and second embodiments, in case of adding an accelerator to the existing storage device that is not equipped with an accelerator or in case of substituting the compression decompression engine 127 of the storage device illustrated in the comparative example of FIG. 5. This is because the access control to the drive 130 can be performed with the CPU 120 as in the related art so that functions to be installed in the accelerators 146 can be reduced, and the accelerators 146 do not require direct access to the drives 130 so that many options for mounting locations of the accelerators 146 can be obtained.

(1) Data Reading Procedure According to Third Embodiment

Figure 13:
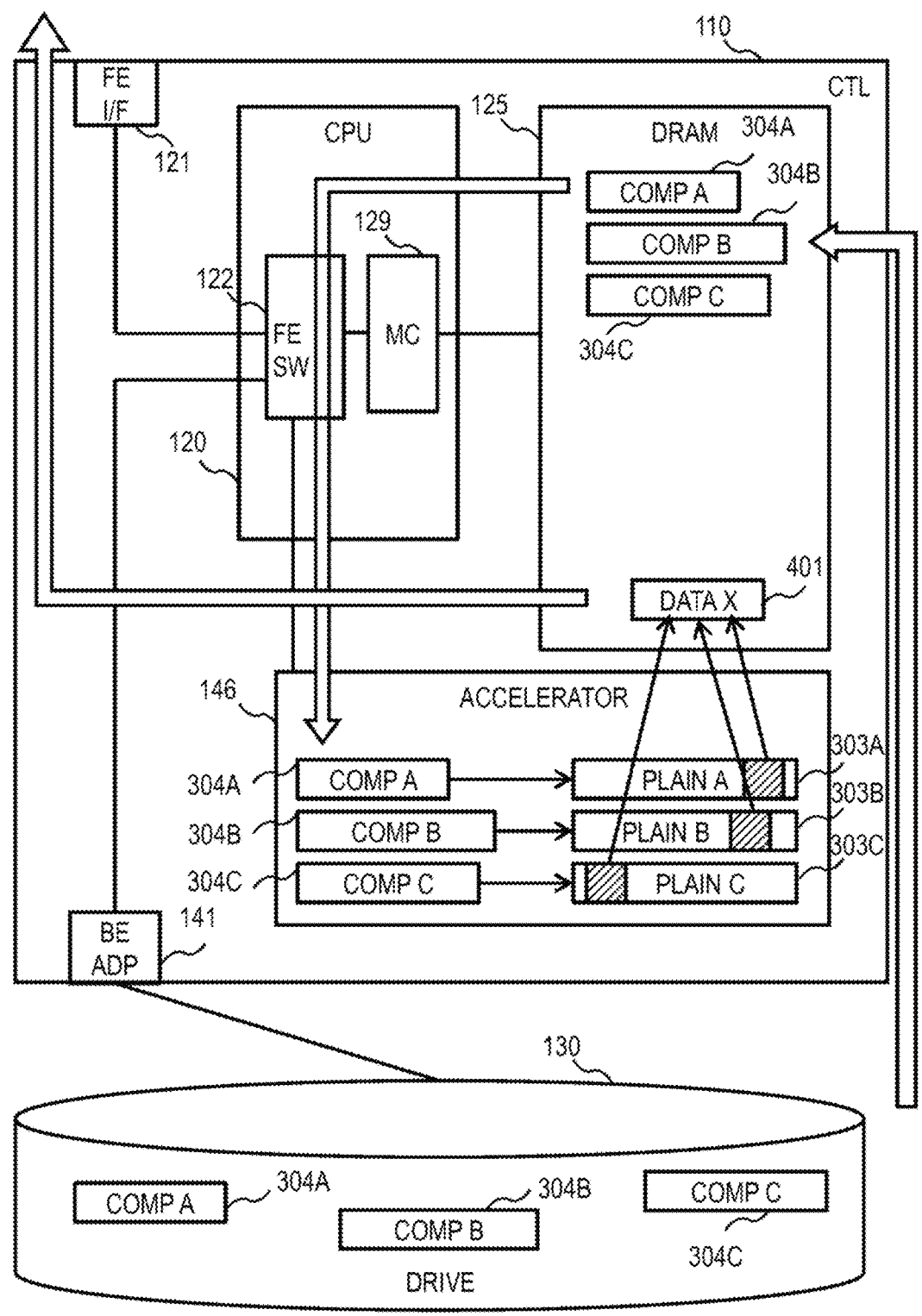
FIG. 13 illustrates an outline of a data reading procedure of the third embodiment.

With reference to FIG. 13, the data reading procedure according to the third embodiment is described. FIG. 13 illustrates the data reading procedure when the compression unit is expanded according to the third embodiment. The CPU 120 reads the three items of 64 kB compressed data (Comp_A (304A), Comp_B (304B), and Comp_C (304C)) from the drive 130 to the DRAM 125 via the BE_ADP 141, the FE_SW 122, and the memory controller 129. Subsequently, the CPU 120 transmits the three items of the 64 kB compressed data 304A, 304B, and 304C from the DRAM 125 to the accelerator 146 via the memory controllers 129 and the FE_SWs 122 and instructs the decompression of these. In this manner, the compressed data 304A, 304B, and 304C stored in the drive 130 are transmitted to the DRAM 220 via the DRAM 125.

Subsequently, the accelerator 146 decompresses the three items of the 64 kB compressed data 304A, 304B, and 304C and stores three items of the 64 kB plaintext data Plain_A (303A), Plain_B (303B), and Plain_C (303C) in the DRAM 220. The accelerator 146 extracts three designated items of 8 kB plaintext data from the three items of the 64 kB plaintext data 303A, 303B, and 303C and transmits the data to the DRAM 125 via the FE_SW 122 and the memory controller 129. The CPU 120 configures the read data Data_X (401) requested by the host 102 from the three items of the 8 kB plaintext data and responds to the host 102 via the FE_SW 122 and the FE_I/F 121.

(2) Comparison of Transmission Amounts in Data Reading including Third Embodiment With reference to FIG. 14, in the data reading according to the third embodiment, the amounts of the data transmitted through the storage device 100 are compared. Table 1400 of FIG. 14 shows an example of transmission directions and the data amounts (unit of kB) of the data passing through each component inside the storage device 100 when the storage device 100 responds with the three items of the 8 kB plaintext data illustrated in FIG. 13 according to the read request of the host 102.

A column 1401 shows component names, and a column 1402 shows transmission directions (input, output, transmission sources, or transmission destinations). A column 1403 corresponds to the column 704 illustrated in FIG. 7 and shows transmission data amounts when the compression unit is expanded to 64 kB in the data reading of the comparative example. A column 1404 corresponds to the column 705 illustrated in FIG. 7 and shows a transmission data amount when the compression unit is expanded to 64 kB in the data reading according to the first embodiment. A column 1405 shows transmission data amounts when the compression unit is expanded to 64 kB in the data reading according to the third embodiment. In Table 1400, the data amount of a portion of cells is shown as the sum of three values, and each value shows the data size of the data (compressed or plaintext data) of the compression unit. The trial calculation of data size illustrated in FIG. 14 is performed in the same condition as in FIG. 7, and thus the description of the duplicated contents is omitted.

With reference to FIGS. 13 and 14, the flow of the data according to the third embodiment shown by the column 1405 is described. The three items of the 64 kB compressed data 304A, 304B, and 304C are stored from the drives 130 to the DRAMs 125 via the BE_ADP 141, the FE_SWs 122, and the memory controllers 129 (rows "1", "A", and "B"). The three items of the 64 kB compressed data 304A, 304B, and 304C are transmitted from the DRAM 125 to the accelerator 146 via the memory controller 129 and the FE_SW 122 (rows "C", "D", and "2"). The three items of the 64 kB compressed data 304A, 304B, and 304C are transmitted from the DRAM 220 to the FPGA 210 in the accelerator 123 (rows "3" and "4").

Subsequently, the three decompressed items of the 64 kB plaintext data 303A, 303B, and 303C are transmitted from the FPGA 210 to the DRAM 220 in the accelerator 123 (rows "5" and "6"). The three items of 8 kB plaintext data extracted from the three items of the 64 kB plaintext data 303A, 303B, and 303C are transmitted from the DRAM 220 to the DRAM 125 via the FE_SW 122 and the memory controller 129 (rows "7", "8", "15"). The read data 401 is configured with the three items of 8 kB plaintext data transmitted from the DRAM 125 to the CPU 120 (rows "18"), and transmitted to the host 102 via the FE_SW 122 and the FE_I/F 121 (rows "19").

The third row from the bottom of Table 1400 shows the sum of the data amounts that are input and output to the DRAM 220 in the accelerator 146. The second row from the bottom shows the sum of the data amounts that are input and output to the DRAM 125. Compared with the first embodiment shown in the column 1404 and the third embodiment shown in the column 1405, the data amounts that are input and output to the DRAM 220 are the same. Meanwhile, the data amount that is input and output to the DRAM 125 according to the third embodiment is larger by 152 kB. However, with respect to the comparative example shown in the column 1403, the third embodiment can reduce the data amount that is input and output to the DRAM 125 by a half or more (from 416 kB to 200 kB).

The first row from the bottom of Table 1400 shows the sum of the data amounts that are input and output to the DRAM 125 via the FE_SW 122 in the CPU 120. Compared with the first embodiment shown in the column 1404 and the third embodiment shown in the column 1405, the input and output data amount of the third embodiment is larger than the input and output data amount of the first embodiment by 152 kB. However, with respect to the comparative example illustrated in the column 1403, the third embodiment can reduce the input and output data amount by about a half (from 368 kB to 200 kB).

From the above, the third embodiment is less effective than the first and second embodiments, but can reduce the bandwidth consumption of the DRAM 125 and the FE_SW 122 in the CPU 120. Therefore, when these bandwidths become a bottleneck of the read performance of the storage device 100, the read performance of the storage device 100 can be enhanced by applying the third embodiment.

(3) Flowchart of Data Reading Procedure According to Third Embodiment

Figure 15:
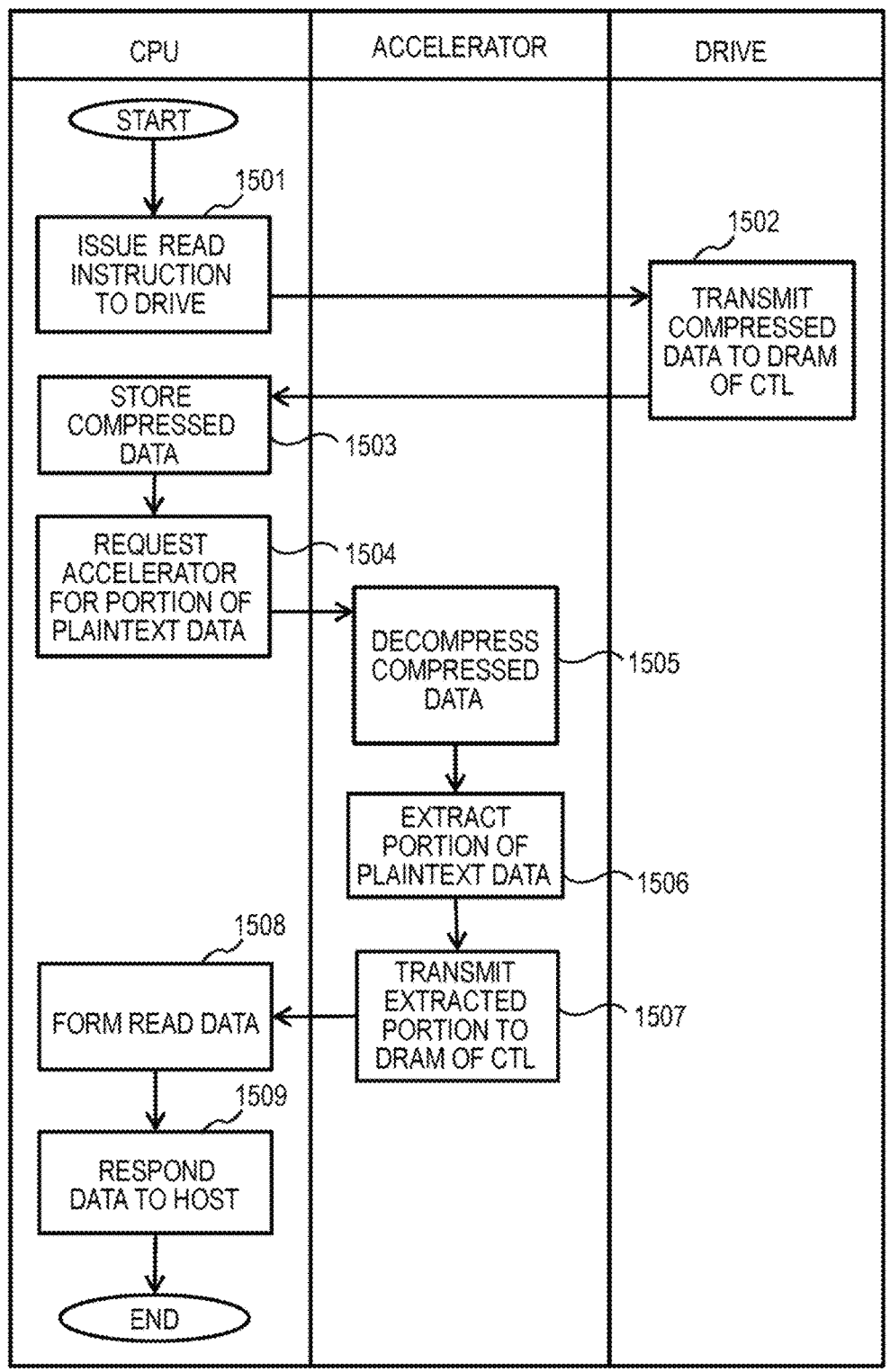
FIG. 15 illustrates transmission amount comparison with the first embodiment in an example of the data reading of the third embodiment.

FIG. 15 illustrates a flowchart of data reading procedure according to the third embodiment. The processes performed by the CPU 120, the accelerator 146, and the drive 130 are divided into three columns.

First, the CPU 120 issues a read instruction of compressed data to the drive 130 (1501). The drive 130 transmits compressed data read according to the read instruction to the DRAM 125 connected to the CPU 120 (in FIG. 15, DRAM of CTL) (1502). The CPU 120 stores the compressed data to the DRAM 125 (1503).

Subsequently, the CPU 120 sends the compressed data to the accelerator 146 and requests a portion of the plaintext data (1504). This request includes a start address (second address), a size, and a transmission destination of the portion of the data required for the read response to the host 102 for each item of the 64 kB plaintext data 303A to 303C.

The accelerator 146 decompresses the 64 kB compressed data 304A, 304B, and 304C according to the request (1505). According to the request parameter of Step 1504, a portion of the data is extracted from each item of the 64 kB plaintext data 303A, 303B, and 303C which is decompression result (1506). The accelerator 146 transmits a portion of the extracted data to the DRAM 125 connected to the CPU 120 (in FIG. 15, the DRAM of CTL) (1507).

The CPU 120 forms the read data 401 by using these portions of the data (1508). Lastly, the CPU 120 responds to the host 102 with the read data 401 (1509). As described above, the accelerator 146 receives a request including compressed data and a start address of the data extracted from plaintext data from the CPU 120. The accelerator 146 reads the compressed data from the DRAM 125 of the CPU 120, decompresses the data, and extracts the data from the plaintext data according to the designated start address. According to the above flow, the process of the CPU 120 is reduced, and the performance of the storage device can be increased.

The present invention is not limited to the storage device 100 having the components illustrated in FIG. 1, 11, or 12 as the components in the storage controller 110. For example, the present invention may be the storage device 100 equipped with an accelerator that encodes data in the storage controller 110 or the drive box 111.

The present invention is not limited to the above embodiments, and includes various modifications. For example, the above embodiments are described in detail in order to describe the present invention for easier understanding, and is not limited to the one necessarily including all the described configurations. Further, a portion of a configuration of one embodiment can be replaced with a configuration of another embodiment, and a configuration of another embodiment can be added to a configuration of one embodiment. With respect to a portion of the configuration of each embodiment, another configuration may be added, removed, or substituted.

Apart or all of each of the above configuration, function, and processing units may be realized by hardware, for example, by being designed with integrated circuits. In addition, each of the above configurations, functions, and the like may be realized by software by a processor interpreting and executing programs that realize respective functions. Information such as programs, tables, and files that realize each function can be placed in a recording device such as a memory, a hard disk, and a solid state drive (SSD) or a recording medium such as an IC card or an SD card.

In addition, control lines and information lines required for the description are merely illustrated, and not all the control lines and the information lines on the product are necessarily illustrated. In practice, it can be considered that almost all configurations are connected to each other.

What is claimed is:

1. A storage device comprising:
a storage controller; and
one or more storage drives where the storage controller reads and writes data,
wherein the storage controller reads compressed data from the one or more storage drives and generates read data requested from a host from the compressed data,
wherein a configuration of the read data includes, depending on a compression unit of the compressed data, a case where the read data consists of plaintext data decompressed from the compressed data and a case where the read data consists of designated data that is part of plaintext data decompressed from the compressed data, wherein the storage controller includes:

a first memory;

a process device that stores data in the first memory and reads the data from the first memory; and an accelerator, including a second memory different from the first memory, wherein, in the case where the read data consists of the designated data that is part of plaintext data decompressed from the compressed data, the process device:

transmits a first instruction to the one or more storage drives to transmit the compressed data; and transmits a second instruction including an internal address of a portion to be extracted from the compressed data to extract the designated data to the accelerator, and wherein the accelerator:

receives the second instruction including the internal address of a portion to be extracted from the compressed data to extract the designated data from the process device;

stores the compressed data transmitted from the one or more storage drives in the second memory;

decompresses the compressed data stored in the second memory to generate plaintext data;

extracts the designated data that is part of the plaintext data from the plaintext data according to the internal address; and stores the extracted designated data to the first memory.

2. The storage device according to claim 1, further comprising:

a drive box that includes a plurality of storage drives including the one or more storage drives and a switch that bundles data transmission paths between the plurality of storage drives and the process device, wherein the accelerator is connected to the switch in the drive box.

3. The storage device according to claim 1, wherein the accelerator:

stores a plurality of items of compressed data stored in the one or more storage drives in the second memory;

generates plaintext data from each of the plurality of items of compressed data; and extracts the designated data in the process device from each item of the plaintext data, and wherein the process device collects the extracted designated data, forms read data, and responds to a host.

4. A method that is executed by a storage device, wherein the storage device includes:

a storage controller; and one or more storage drives where the storage controller reads and writes data, wherein the storage controller reads compressed data from the one or more storage drives and generate read data requested from a host from the compressed data, wherein a configuration of the read data includes, depending on a compression unit of the compressed data, a case where the read data consists of plaintext data decompressed from the compressed data and a case where the read data consists of designated data that is part of plaintext data decompressed from the compressed data, wherein the storage controller includes:

a first memory;

a process device that stores data in the first memory and reads the data from the first memory; and an accelerator, including a second memory different from the first memory, and wherein, in the case where the read data consists of the designated data that is part of the plaintext data decompressed from the compressed data, the method comprises the steps of:

by the process device:

transmitting a first instruction to one or more storage drives to transmit the compressed data, and transmitting a second instruction including an internal address of a portion to be extracted from the compressed data to extract the designated data to the accelerator, and by the accelerator:

receiving the second instruction including the internal address of a portion to be extracted from the compressed data to extract the designated data from the process device;

storing the compressed data transmitted from the one or more storage drives in the second memory;

decompressing the compressed data stored in the second memory to generate plaintext data;

extracting the designated data that is part of the plaintext data from the plaintext data according to the internal address; and storing the extracted designated data to the first memory.

5. The method according to claim 4, further comprising the steps of:

by the accelerator:

storing a plurality of items of compressed data stored in the one or more storage drives in the second memory;

generating plaintext data from each of the plurality of items of compressed data; and extracting data designated in the process device from each item of the plaintext data, and by the process device:

collecting the extracted designated data;

forming read data; and responding to a host.

6. The storage device according to claim 1, wherein the accelerator stores the compressed data transmitted from the one or more storage drives without going through the first memory in the second memory.

7. The storage device according to claim 1, wherein the accelerator stores the compressed data transmitted from the one or more storage drives through the first memory in the second memory.

* * * * *